United States Patent
Abendroth et al.

(10) Patent No.: US 10,351,717 B2
(45) Date of Patent: Jul. 16, 2019

(54) COATING, METHOD FOR THE PRODUCTION THEREOF AND USE THEREOF

(71) Applicant: Fraunhofer-Gesellschaft zur Foerderung der angewandten Forschung E.V., Munich (DE)

(72) Inventors: Thomas Abendroth, Dresden (DE); Holger Althues, Dresden (DE); Gerrit Maeder, Dresden (DE); Stefan Kaskel, Dresden (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 55 days.

(21) Appl. No.: 14/773,828

(22) PCT Filed: Mar. 13, 2014

(86) PCT No.: PCT/DE2014/000141
§ 371 (c)(1),
(2) Date: Sep. 9, 2015

(87) PCT Pub. No.: WO2014/139511
PCT Pub. Date: Sep. 18, 2014

(65) Prior Publication Data
US 2016/0017157 A1    Jan. 21, 2016

(30) Foreign Application Priority Data
Mar. 14, 2013 (DE) .......... 10 2013 004 611

(51) Int. Cl.
*C09D 5/32* (2006.01)
*C23C 16/40* (2006.01)
(Continued)

(52) U.S. Cl.
CPC ............ *C09D 5/32* (2013.01); *C04B 35/52* (2013.01); *C09D 1/00* (2013.01); *C09D 5/004* (2013.01);
(Continued)

(58) Field of Classification Search
CPC ...................................................... C09D 5/32
See application file for complete search history.

(56) References Cited

U.S. PATENT DOCUMENTS

| 2006/0060825 | A1 | 3/2006 | Glatkowski | |
| 2006/0188723 | A1* | 8/2006 | Rowley | B82Y 10/00 428/408 |

(Continued)

FOREIGN PATENT DOCUMENTS

| KR | 20110047515 A | 5/2011 | |
| WO | WO 2012141908 A1 * | 10/2012 | ....... H01L 31/02168 |
| WO | WO 2013/192180 A2 | 12/2013 | |

OTHER PUBLICATIONS

"Protective Coatings for Atomic Oxygen Susceptible Spacecraft Materials—STS-41G results," Whitaker et al., Shuttle Environment and Operations II Conference, Houston, TX, Nov. 13-15, 1985, Technical Papers (A86-14376 03-16), p. 160-168.*

(Continued)

*Primary Examiner* — Ian A Rummel
(74) *Attorney, Agent, or Firm* — Jacobson Holman, PLLC.

(57) ABSTRACT

The invention relates to a coating which has special absorption properties for electromagnetic radiation from the wavelength spectrum of sunlight and to a method for producing the coating and to its use. The coating is formed by a layer which is formed on the surface of a substrate or on a reflective layer formed on the surface of the substrate. Carbon nanotubes are contained in the layer. The proportion of carbon nanotubes contained per unit of area or unit of (Continued)

Figure 1:
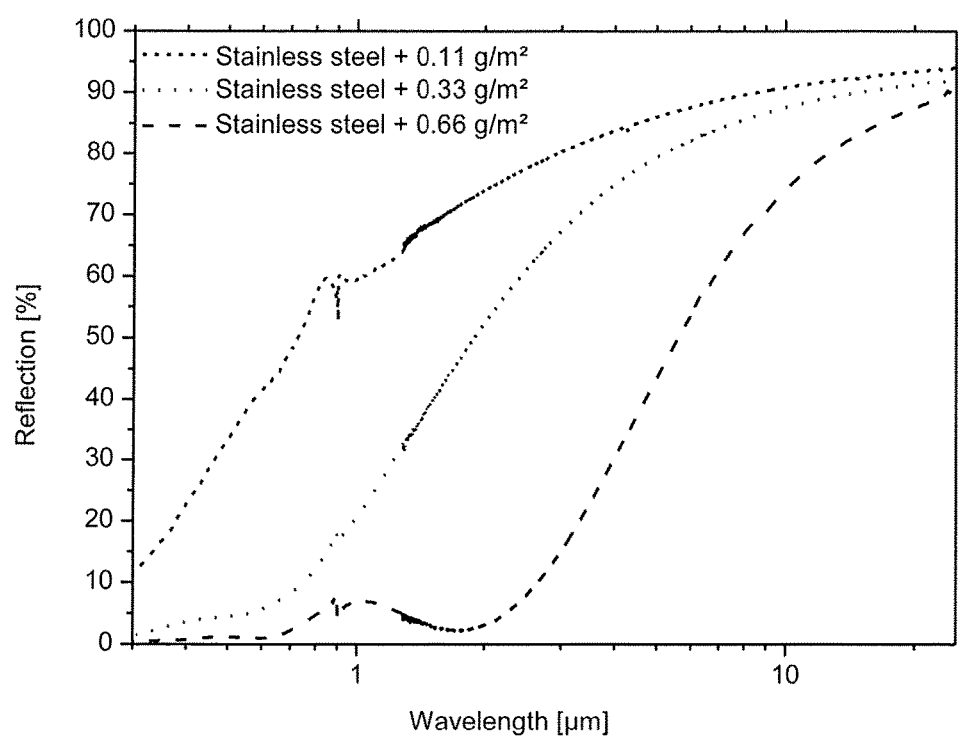

volume and/or the layer thickness of the layer is selected such that it absorbs electromagnetic radiation from the wavelength spectrum of sunlight at predefinable proportions and the proportion of electromagnetic radiation from the wavelength spectrum of a black radiator at a temperature greater than 50° C. which is emitted is very small.

14 Claims, 3 Drawing Sheets

(51) Int. Cl.
    *C23C 16/02*     (2006.01)
    *C04B 35/52*     (2006.01)
    *C09D 1/00*     (2006.01)
    *C09D 5/33*     (2006.01)
    *F24S 70/20*     (2018.01)
    *F24S 70/30*     (2018.01)
(52) U.S. Cl.
    CPC ...... *C23C 16/0209* (2013.01); *C23C 16/0227* (2013.01); *C23C 16/40* (2013.01); *C23C 16/402* (2013.01); *C23C 16/403* (2013.01); *C23C 16/405* (2013.01); *C23C 16/407* (2013.01); *F24S 70/20* (2018.05); *F24S 70/30* (2018.05); *Y02E 10/40* (2013.01)

(56) References Cited

U.S. PATENT DOCUMENTS

| 2008/0076837 A1* | 3/2008 | Kuper | B82Y 30/00 516/32 |
| 2008/0176071 A1* | 7/2008 | Choi | B82Y 30/00 428/368 |
| 2012/0090658 A1 | 4/2012 | Street | |

OTHER PUBLICATIONS

"Protective Coatings for Atomic Oxygen Susceptible Spacecraft Materials—STS-41G results," bibliography page.*
"Protective Coatings for Atomic Oxygen Susceptible Spacecraft Materials—STS-41G results," Whitaker et al., Shuttle Environment and Operations II Conference, Houston, TX, Nov. 13-15, 1985, Technical Papers (A86-14376 03-16), bibliography page (Year: 1985).*

* cited by examiner

COATING, METHOD FOR THE PRODUCTION THEREOF AND USE THEREOF

The invention relates to a coating which has special absorption properties for electromagnetic radiation from the wavelength spectrum of sunlight and to a method for producing the coating and to its use.

It can in particular be used when solar radiation is to be utilized for the generation of energy or heat. The wavelength spectrum can in this respect be used in a wavelength-selective and targeted manner. In this respect, in particular the absorption of the electromagnetic radiation of the spectrum of the radiation emitted by the sun onto a surface plays a special role.

It is thus usual to provide absorber coatings in the production of absorber tubes which are used in parabolic trough collectors. The actual absorbing layer is formed from a cermet in this respect. In addition, further barrier layers and reflective layers are required and usual with such absorber coatings. All these layers are in this respect formed by means of known vacuum coating processes, which causes a correspondingly high production effort and costs. In addition, a complex and/or expensive surface processing of a substrate to be coated in this manner is required. The higher the number of layers to be used, the higher the proportion of radiation losses so that the proportion of useful radiation energy is thereby reduced.

The absorption and emission properties of these absorber coatings are determined by the materials and layer thicknesses used.

It is therefore the object of the invention to provide possibilities with which a simple and inexpensive coating can be formed whose absorption and/or emission properties can be predefined, which in particular relates to specific selected wavelengths or wavelength ranges of electromagnetic radiation.

This object is achieved in accordance with the invention by a coating having the features of claim 1. It can be produced using a method in accordance with claim 9. Claim 11 provides uses.

Advantageous embodiments and further developments of the invention can be realized using features designated in subordinate claims.

The coating in accordance with the invention is formed by a layer which is formed on the surface of a substrate. It can also be formed on a reflective layer formed on the surface of the substrate.

Carbon nanotubes are contained in the layer. In this respect, the proportion of carbon nanotubes contained per unit of surface or volume and/or the layer thickness of the layer is/are selected such that electromagnetic radiation from the wavelength spectrum of sunlight is absorbed at predefinable proportions. The proportion of electromagnetic radiation from the wavelength spectrum of a black radiator at a temperature greater than 50° C., preferably greater than 200° C., and particularly preferably greater than 350° C., should be emitted considerably less. This proportion should be less than 25%, preferably less than 15%.

In this respect, the proportion absorbed by the layer should be considerably larger than the emitted proportion of these radiations.

It can in this respect be thermal radiation which is above the wavelengths of the wavelength spectrum of the sun. In this respect, the proportion absorbed by the layer should be considerably larger than the emitted proportion of these radiations.

The layer absorbs the greater part of the radiation emitted onto the layer by the sun and a considerably smaller proportion of radiation from the wavelength spectrum of the radiation emitted by a black radiator is particularly advantageously emitted so that radiation-induced heat losses can be reduced.

In this respect, a considerably larger proportion should be understood as a proportion of at least 75%, preferably of at least 90%. This should apply to the total spectral range of the radiation emitted by the sun. Selected wavelength ranges should accordingly be almost completely absorbed.

The layer is formed with carbon nanotubes and the absorption properties, emission properties and/or transmission properties, in particular the absorbed proportion of radiation, can be influenced by the mass portion of carbon nanotubes per unit of surface or unit of volume on the surface of the substrate.

The carbon nanotubes forming the layer should be arranged irregularly over the surface of the substrate in the reflective layer. They should in this respect be aligned mainly in parallel in a plane which is aligned in parallel with the surface of the substrate or a reflective layer formed on the surface of the substrate.

Since the layer formed by the carbon nanotubes is in particular not mechanically resistant and can thereby be removed on contact, it is advantageous to cover the layer formed by the carbon nanotubes with a protective layer. The protective layer can preferably be formed from an oxide. An oxide can be used which is selected from $SnO_2$, $TiO_2$, $SiO_2$, ZnO, $In_2O_3$ and $Al_2O_3$. The protective layer should have a layer thickness in the range from 20 nm to 1000 nm.

The protective layer should have a high transparency or a high reflectance for radiation emitted by a black radiator. It can, for example, be formed from $SiO_2$, $TiO_2$ or $Al_2O_3$, whereby a high transparency can be achieved in the wavelength range of IR light. $SnO_2$, $SnO_2$:F or other electrically conductive and optically transparent oxides (TCOs) are reflective in this wavelength range.

In addition to the mechanical protection, a protection against thermal influences and in this respect in particular against oxidation can be achieved with a protective layer.

The substrate should be coated on the surface of the substrate with a material which reduces the emission of electromagnetic radiation or should be formed from such a material such that heat losses starting from the substrate in the direction of the environment due to irradiated radiation can be reduced. This material can be selected from steel, aluminum, copper, silver, gold, nickel, molybdenum and palladium. It can thus be achieved that energy losses as a result of emitted radiation can at least be considerably reduced. An emission of electromagnetic radiation from the wavelength range of the radiation which is emitted by a black radiator can thus in particular be reduced or even avoided, starting from the heated substrate.

There is, however, also the possibility in the invention of using a material for a protective layer which reflects electromagnetic radiation from the wavelength range of infrared light and which is optically transparent for lower wavelengths. It should in this respect in particular reflect the electromagnetic radiation from the wavelength spectrum of a black radiator by at least 50%. Electrically conductive oxides (TCOs) can be used as the material, for example.

Carbon nanotubes should be contained in the layer having a proportion of at least 0.05 $g/m^2$ and a maximum of 5 $g/m^2$, preferably at least 0.25 $g/m^2$ and a maximum of 2.5 $g/m^2$. In this respect, the predefinable wavelength is displaced in the direction of higher wavelengths with an increased proportion of contained carbon nanotubes.

The layers containing carbon nanotubes can have a layer thickness in the range from 10 nm to 2000 nm, preferably from 100 nm to 1000 nm.

The most varied different carbon nanotubes can be used, e.g. SWCNTs or MWCNTs. Differently dimensioned carbon nanotubes can also be used in accordance with the invention. In addition to the number of walls, the structure (roll-up factor), the respective diameters, lengths of the carbon nanotubes, their purity (purified, non-purified) as well as possibly contained contaminants (different metals, catalysts, carbon in other modifications) also have an influence on the optical properties.

A procedure can be followed in the production of a coating in accordance with the invention that an aqueous dispersion in which at least one surfactant and carbon nanotubes are uniformly distributed is applied to the surface of a substrate or of a reflective layer which is formed on the substrate surface and which is formed from a material which reflects at least 60% of the electromagnetic radiation with a wavelength of greater than the predefined wavelength. The water is subsequently removed by a drying and the surfactant is subsequently removed by means of a solvent. The absorption properties and/or transmission properties of the layer formed in this manner can be influenced by the proportion of carbon nanotubes which has been observed in the dispersion.

The application of the dispersion can take place using different procedures; spray processes, dipping processes or printing processes are thus inter alia suitable.

The initially already described protective layer can preferably be formed using a CVD process at atmospheric pressure conditions or in a wet chemical manner. In this respect, possibilities for the formation of such a protective layer will be described in embodiments in the following.

The coating in accordance with the invention can be used in absorbers for solar technology applications. This in particular relates to the production of absorber tubes which can particularly preferably be used in parabolic trough collectors.

The invention is particularly characterized with respect to the prior art by the simple and inexpensive production capability since vacuum coating technologies can at least very largely be dispensed with. At least the actual absorbing layer can be formed without such a complex method.

The material costs are also relatively low due to the small required proportion of carbon nanotubes.

The invention will be explained in more detail in the following with reference to examples.

Figure 2:
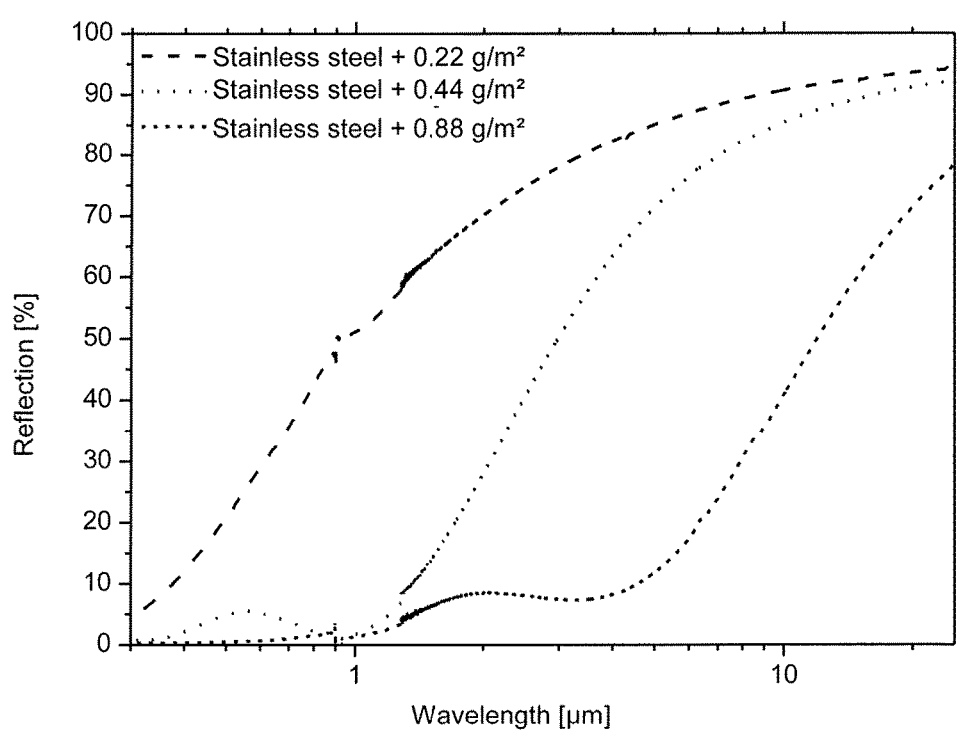
Figure 3:
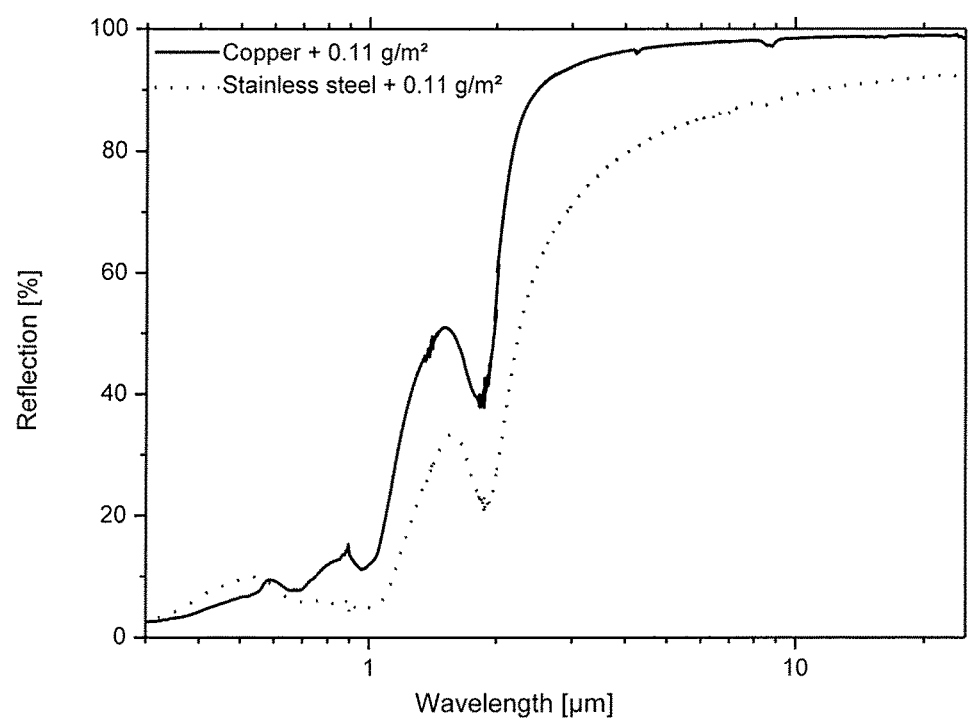

There are shown:

FIG. 1 a diagram of the reflective behavior of layers having different proportions of carbon nanotubes per surface at different wavelengths;

FIG. 2 a diagram of the reflective behavior of layers having different proportions of carbon nanotubes per surface at different wavelengths; and FIG. 3 the reflective behavior of a layer containing single-wall carbon nanotubes which is formed on different substrate materials (copper+stainless steel).

FIGS. 1 and 2 show diagrams of the reflective behavior of layers having different proportions of carbon nanotubes per surface at the different wavelengths. In this respect, the increased influence of the contained carbon nanotube proportions on the reflective behavior and in so doing the displacement of a predefined wavelength in the direction of higher wavelengths with an increasing proportion of carbon nanotubes can be recognized.

The layers formed with multi-wall carbon nanotubes (MWCNTs) were deposited on a stainless steel substrate (SS1.4301, IIId).

FIG. 3 shows the reflective behavior of a layer containing single-wall carbon nanotubes (SWCNTs) which was deposited on different substrate materials (copper+stainless steel). The good absorption behavior is in this respect decisively determined by the CNT layer. The selectivity edge can clearly be seen at approx. 2 µm. At higher wavelengths, the CNT layer is transparent, which can be shown by the differently reflective substrates. The emission of the total layer system is therefore determined by the substrate surface used. The solar absorption is decisively generated by the applied CNT layer.

The examples shall generally be preceded by how the production of a dispersion and further subsequent method steps should be carried out. This explanation then also applies at least analogously to specific examples still to be described.

Carbon nanotubes and a suitable surfactant are added into a vessel containing liquid, preferably water, in the manufacture of the dispersion. Since carbon nanotubes (CNTs) are greatly inclined to agglomerate, agglomerates or clusters are broken up by means of an ultrasound treatment. The CNTs can be stabilized in the liquid (water) by the surfactant and a repeat agglomerating can be prevented.

Agglomerates possibly still contained in the dispersion can be removed by centrifuging to obtain a homogeneous dispersion.

A dispersion obtained in this manner has long-term stability and can e.g. be applied by spraying. The drying, which can be accelerated by a heating, takes place after the application of the dispersion. After the drying, a layer of a network of CNTs and the respective surfactant remains on the surface. Since surfactants influence the optical properties, the surfactant should be removed. For this purpose, a solvent suitable for the respective surfactant (e.g. ethanol) can be used with which it can be removed by elution. The CNTs alone remain on the surface after the elution step. They adhere with little mechanical stability and can easily be removed on touch or on other contacts. In addition, they are not very well protected from thermal influences or also from other external influences.

For these reasons, the layer formed with the CNTs can be fixed and protected by a thermally stable and optically transparent protective layer. An oxidation protection can thereby also be obtained. The protective layer should be optically transparent at least in the wavelength range in which electromagnetic radiation (≤the predefinable wavelength) should be absorbed at an elevated level and should also not reflect this radiation. It can be formed as an antireflective coating.

EXAMPLE 1a

A dispersion was sprayed onto a substrate surface of polished stainless steel 1.4301 (IIId) by means of an airbrush nozzle at a working pressure of 4 bar.

The dispersion was manufactured in that 0.1 wt. % of multi-wall CNTS such as are commercially available from the company Nanocyl, and 0.1 wt. % sodium dodecylbenzene sulfonate are added to water as a suitable surfactant. The mixture was exposed to ultrasonic waves of a frequency of 20 kHz over a period of 5 min. to break open agglomerates.

The dispersion was subsequently centrifuged at 3260 g for 5 min. 80% of the dispersion was removed from the top and sprayed onto a surface having a size of 150*150 mm².

In this respect, layer was able to be obtained on the surface of the layer after the drying and elution of the surfactant in which approx. 0.5 g/m² CNTs were present.

Subsequent to this, a protective layer of $SiO_2$ was applied to the layer.

For this purpose, 10 ml water, 50 ml ethanol, 50 ml tetraethyl orthosilicate and 10 ml 100% acetic acid were mixed and the mixture was applied to the layer by dip coating. The dipping took place in this respect once at a speed of 1 mm/s.

Drying then took place for 5 min. and subsequent to this a heat treatment was carried out at 350° C. over a time period of 5 min. After this tempering, a protective layer of $SiO_2$ having a layer thickness of 300 nm was obtained in a wet chemical manner. Other layer thicknesses can, however, also be obtained, for example 20 nm, 40 nm or 60 nm.

Instead of a protective layer of $SiO_2$, a protective layer of $Al_2O_3$, as described below, can be formed.

100 ml Al(iPrO)₃ (60 g/l) are prepared in n-butanol with approx. 1 vol. % of concentrated $HNO_3$ in the form of a solution as the precursor. The coating again takes place either by dip coating with a single dipping at a dipping speed of 1 mm/s.

The drying took place over 5 min. A heat treatment at 350° C. was likewise carried out over 5 min.

The protective layer had a thickness of 40 nm.

EXAMPLE 1b

A dispersion was sprayed onto a substrate surface of copper by means of an airbrush nozzle at a working pressure of 4 bar.

The dispersion was manufactured in that 0.05 wt. % SWCNTs and 1 wt. % sodium dodecylbenzene sulfonate were added into water as a suitable surfactant. The mixture was exposed to ultrasonic waves of a frequency of 20 kHz over a period of 15 min. to break open agglomerates.

The dispersion was subsequently centrifuged at 3260 g for 5 min. 80% of the dispersion was removed from the top and sprayed onto a surface having a size of 150*150 mm².

In this respect, after the drying and elution of the surfactant, layers were able to be obtained on the surface in which approx. 0.1 g/m² to 0.5 g/m² CNTs were present.

Subsequent to this, a protective layer of $SiO_2$ was applied to the layer.

For this purpose, 10 ml water, 50 ml ethanol, 50 ml tetraethyl orthosilicate and 10 ml 100% acetic acid were mixed and the mixture was applied to the layer by dip coating. The dipping took place in this respect once at a speed of 1 mm/s.

Drying then took place for 5 min. and subsequent to this a heat treatment was carried out at 350° C. over a time period of 5 min. After this tempering, a protective layer of $SiO_2$ having a layer thickness of 300 nm was obtained in a wet chemical manner. Other layer thicknesses can, however, also be obtained, for example 20 nm, 40 nm or 60 nm.

Instead of a protective layer of $SiO_2$, a protective layer of $Al_2O_3$, as described below, can be formed.

100 ml Al(iPrO)₃ (60 g/l) are prepared in n-butanol with approx. 1 vol. % of concentrated $HNO_3$ in the form of a solution as the precursor. The coating again takes place by dip coating with a single dipping at a dipping speed of 1 mm/s.

The drying took place over 5 min. A heat treatment at 350° C. was likewise carried out over 5 min.

The protective layer had a thickness of 40 nm.

EXAMPLE 2

In this example, a protective layer of $TiO_2$ was applied to a layer which was formed as in Example 1. In this respect, a CVD process was used under atmospheric pressure conditions and titanium tetraisopropoxide and water were used as precursors. A temperature of 200° C. was observed. A suitable corresponding procedure is described in DE 10 2008 052 091 A1 so that reference is made to its disclosure content and this is also to be made the subject of this description.

The formed protective layer had a layer thickness of 65 nm.

EXAMPLE 3

A dispersion was applied to the surface of a polished stainless steel substrate 1.4301 (IIId) in which 0.1 wt. % multi-wall carbon nanotubes (MWCNTs) as well as 0.1 wt. % sodium dodecylbenzene sulfonate were contained as a surfactant in water. The dispersion was deagglomerated by means of ultrasonic waves at a frequency of 20 KHz for 5 min. The dispersion was subsequently centrifuged at 3260 g for 5 min. 80% of the dispersion was removed from the top so that no agglomerates were sprayed on the application onto the surface which took place using an airbrush nozzle at a working pressure of 4 bar.

After the drying and elution, which can be carried out as in Example 1, a protective layer was applied to the layer formed by the CNTs, the protective layer additionally reflecting electromagnetic radiation from the wavelength range of infrared light by at least 50%. In principle, different radiation-selective, optically transparent, electrically conductive oxides (e.g. ITO, AZO, inter alia) can be used for this purpose. In this example, the protective layer was formed using the IR reflective properties of tin oxide doped with fluorine.

In this respect, a CVD process was again used at atmospheric pressure conditions such as was the case in Example 2. $SnCl_4$ and 5 wt. % HF were used as the precursor. Application took place at a temperature of 400° C. The layer thickness was 500 nm.

The precursors were heated in a bubbler vessel. The vapor pressure of the respective precursor liquid which is adopted is conveyed to the substrate surface via a carrier gas flow. The bubbler temperature to be selected is dependent on the vapor pressure curve of the precursor fluid. With tin tetrachloride ($SnCl_4$), the bubbler temperature was regulated to 20° C.; with the 5 wt. % HF, it was 50° C. Nitrogen was used as the carrier gas. The carrier gas volume flow in the bubbler vessel containing $SnCl_4$ was 0.5 slm. The carrier gas volume flow in the bubbler vessel containing HF was approx. 3 slm. The gas lines from the bubbler vessel up to a coating head were heated to 100° C. to avoid condensation of the gaseous precursor. In addition, the carrier gas flow was diluted with additional nitrogen carrier gas flow.

The gas lines of the two precursors were conducted to the coating head separately from one another. The coating head in principle comprises two tubes arranged concentrically in one another.

A hydrolysis reaction takes place between the used precursors (tin tetrachloride and water or hydrogen fluoride) in the CVD process used. A layer formation can be observed from 200° C. The layer deposition rate is greatly temperature-dependent. An oriented crystalline layer growth takes place from substrate temperatures of approx. 300-350° C.

The invention claimed is:

1. A coating for the production of absorbers of technical solar applications comprising
   a) a layer consisting of carbon nanotubes formed on
   b) the surface of a substrate or a reflective layer formed on the surface of a substrate,
wherein the layer consisting of carbon nanotubes absorbs the greater part of radiation emitted thereon by the sun, the carbon nanotubes are present in the layer at a proportion of at least 0.05 g/m$^2$ and a maximum of 5 g/m$^2$, and in this respect the proportion of carbon nanotubes is selected such that (i) the layer consisting of carbon nanotubes absorbs electromagnetic radiation from the wavelength spectrum of sunlight at predefinable proportions and (ii) the layer consisting of carbon nanotubes emits less than 25% of electromagnetic radiation from the wavelength spectrum of a black radiator at a temperature greater than 50° ° C., and wherein the substrate and the reflective layer are independently formed from a material that reflects electromagnetic radiation from the wavelength spectrum of a black radiator by at least 60%.

2. A coating in accordance with claim 1, characterized in that the carbon nanotubes forming the layer are arranged on the surface of the substrate irregularly and in this respect at least predominantly in a plane which is aligned in parallel with one another in parallel with the surface of the substrate or of a reflective layer formed on the surface.

3. A coating in accordance with claim 1, characterized in that the layer formed by the carbon nanotubes is covered by a protective layer.

4. A coating in accordance with claim 1, characterized in that the carbon nanotubes are present in the layer at a proportion of at least 0.25 g/m$^2$ and a maximum of 2.5 g/m$^2$.

5. A coating in accordance with claim 1, characterized in that the layer of carbon nanotubes has a layer thickness in the range from 10 nm to 2000 nm.

6. A coating in accordance with claim 3, characterized in that the protective layer has a layer thickness in the range from 20 nm to 1000 nm.

7. A coating in accordance with claim 3, characterized in that the protective layer reflects electromagnetic radiation from the wavelength range of the radiation emitted by a black radiator by at least 50%.

8. A method of producing a coating in accordance with claim 1, comprising
   applying a dispersion containing at least one surfactant and carbon nanotubes uniformly distributed in a liquid, to the surface of a substrate or of a reflective layer which is formed on the substrate surface, each of which substrate and reflective layer is formed from a material which reflects electromagnetic radiation from the wavelength spectrum of the electromagnetic radiation emitted by a black radiator by at least 60%, and subsequent thereto
   removing the liquid by drying and removing the surfactant by use of a solvent to form a layer consisting of carbon nanotubes, wherein the absorption properties and/or transmission properties of the layer consisting of carbon nanotubes formed in this manner are influenced by the proportion of carbon nanotubes in the dispersion.

9. A method in accordance with claim 8 further comprising applying to the layer consisting of carbon nanotubes an optically transparent, electrically conductive protective layer formed of an optically transparent oxide.

10. A coating in accordance with claim 3, characterized in that the protective layer is an oxide-containing protective layer.

11. A coating in accordance with claim 10, characterized in that the oxide is selected from the group consisting of $SnO_2$, $TiO_2$, $SiO_2$, $ZnO$, $In_2O_3$, and $Al_2O_3$.

12. A coating in accordance to claim 1, characterized in that the material is selected from the group consisting of steel, aluminum, copper, silver, gold, nickel, molybdenum, and palladium.

13. A method in accordance with claim 9, characterized in that the protective layer oxide is $TiO_2$, $SiO_2$, $Al_2O_3$, $ZnO$, or $In_2O_3$.

14. A method in accordance with claim 9, characterized in that applying the oxide-containing protective layer is by chemical vapor deposition (CVD) at atmospheric pressure or in a wet chemical manner.

* * * * *